United States Patent
Zhu (10) Patent No.: US 11,116,092 B1
(45) Date of Patent: Sep. 7, 2021

(54) ELECTRONIC HOUSING ASSEMBLY FOR SURFACE MOUNTED CIRCULATORS AND ISOLATORS

(71) Applicant: JQL Technologies Corp., Mundelein, IL (US)

(72) Inventor: Jiewen Zhu, Mundelein, IL (US)

(73) Assignee: JQL Technologies Corporation, Mundelein, IL (US)

( * ) Notice: Subject to any disclaimer, the term of this patent is extended or adjusted under 35 U.S.C. 154(b) by 0 days.

(21) Appl. No.: 17/034,550

(22) Filed: Sep. 28, 2020

(51) Int. Cl.
| H05K 5/02 | (2006.01) |
| H05K 5/04 | (2006.01) |
| H01P 1/38 | (2006.01) |
| H01P 1/36 | (2006.01) |

(52) U.S. Cl.
CPC ............ *H05K 5/0217* (2013.01); *H01P 1/36* (2013.01); *H01P 1/38* (2013.01); *H05K 5/0247* (2013.01); *H05K 5/04* (2013.01)

(58) Field of Classification Search
CPC .......................... H05K 5/0247; H05K 5/0217
See application file for complete search history.

(56) References Cited

U.S. PATENT DOCUMENTS

| 4,276,522 | A * | 6/1981 | Coerver | .................. | H01P 1/387 |
| | | | | | 333/1.1 |
| 6,337,607 | B1 * | 1/2002 | Genfan | .................... | H01P 1/38 |
| | | | | | 333/1.1 |
| 6,895,665 | B2 | 5/2005 | Sakai | | |
| 6,914,495 | B2 * | 7/2005 | Kocharyan | ............. | H01P 1/387 |
| | | | | | 333/1.1 |
| 7,915,543 | B2 | 3/2011 | Riner | | |
| 7,936,231 | B2 | 5/2011 | Paquette et al. | | |
| 9,750,139 | B2 | 8/2017 | Salamone | | |
| 2001/0040484 | A1 * | 11/2001 | Kim | .......................... | H01P 1/36 |
| | | | | | 333/24.2 |
| 2003/0030501 | A1 | 2/2003 | Hempel et al. | | |

OTHER PUBLICATIONS

Skyworks Solutions, Inc., Data Sheet, SKYFR-001438: 2110 to 2170 MHz Single Junction Robust Lead Isolator, https://www.skyworksinc.com/-/media/SkyWorks/Documents/Products/2401-2500/SKYFR_001438_204043A.pdf, Jul. 6, 2016, 5 pages, Irvine, CA.

* cited by examiner

*Primary Examiner* — Hung V Ngo
(74) *Attorney, Agent, or Firm* — Olav M. Underdal; IDP Patent Services (57) ABSTRACT

An electronic housing assembly includes: a plurality of isolated mounting legs each with a conductive pin and an isolator sleeve; a bottom ring, including a ring body, a plurality of outward protruding ring portions with a central aperture; a bottom mounting assembly, including a bottom plate, and a plurality of inner walls; a top cover, including a top plate and an outer peripheral wall; such that the top cover can be pressed down onto the inner walls of the bottom mounting assembly; with an electronic member, such as an isolator/circulator member, mounted inside the electronic housing assembly.

20 Claims, 9 Drawing Sheets

Electronic Housing Assembly

FIG. 1A
Electronic Housing Assembly

ELECTRONIC HOUSING ASSEMBLY FOR SURFACE MOUNTED CIRCULATORS AND ISOLATORS

CROSS-REFERENCE TO RELATED APPLICATIONS

N/A.

FIELD OF THE INVENTION

The present invention relates generally to the field of surface mounted electronics, and more particularly to methods and systems for housings for isolators and circulators.

BACKGROUND OF THE INVENTION

Electronic housings for surface mounting of circulators and isolators of electronic circuits are well-known and in common use.

Conventional methods for the locking mechanism include a screw-down cover as well as a turn lock cover. However, the screw-down method is not very precise. In many cases, the cover ends up not lining up correctly with the threading of the screws that are holding it in place. This means that the cover is not parallel with the top of the interior isolator/circulator resulting in poorer performance. Additionally, the turn-lock cover requires more complicated assembly and is therefore much more difficult to automate.

As such, considering the foregoing, it may be appreciated that there continues to be a need for novel and improved devices and methods for housings for isolators and circulators.

SUMMARY OF THE INVENTION

The foregoing needs are met, to a great extent, by the present invention, wherein in aspects of this invention, enhancements are provided to the existing model of housings for isolators and circulators.

In an aspect, an electronic housing assembly can include:
a) a plurality of isolated mounting legs, which each can include:
  i. a conductive pin; and
  ii. an isolator sleeve, which is a hollow cylindrical member made from a non-conductive insulation material;
b) a bottom ring, which can include:
  i. a plurality of protruding ring portions, each with a central aperture;
    such that the bottom ring receives an isolator/circulator member, such that each isolated mounting leg protrudes through a corresponding outward protruding ring portion;
c) a bottom mounting assembly, which can include:
  i. a bottom mounting portion; and
  ii. a plurality of inner walls with a plurality of wall openings, such that the inner walls protrude upwards from the bottom plate, wherein each inner wall can include:
    a wall body; and
    protruding tabs; and
d) a top cover, which can include:
  i. a plurality of tab apertures, positioned in an upper portion of the top cover;
  ii. a top plate; and
  iii. an outer peripheral wall, such that the outer peripheral wall is connected to an outer periphery of the top plate, wherein the outer peripheral wall can further include:
    a plurality of wall notches, which the electronic terminals of the electronic member protrude through when the electronic housing assembly is fully assembled;
  wherein the bottom ring with the isolator/circulator member mounted slides over an outer side of the bottom mounting assembly, such that the bottom ring rests on the bottom mounting portion, such that each corresponding inward protruding ring portion of the ring body protrude into a corresponding wall opening and contact with the bottom mounting portion;
  such that the top cover can be pressed down onto the inner walls of the bottom mounting assembly, such that tabs of the inner walls protrude through the tab apertures and can be folded onto the top plate of the top cover, such that the top cover is secured in position, thereby locking the electronic housing assembly with the isolator/circulator member mounted inside the electronic housing assembly.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. In addition, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Before describing the invention in detail, it should be observed that the present invention resides primarily in a novel and non-obvious combination of elements and process steps. So as not to obscure the disclosure with details that will readily be apparent to those skilled in the art, certain conventional elements and steps have been presented with lesser detail, while the drawings and specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

In the following, we describe the structure of an embodiment of an electronic housing assembly 100 with reference to FIG. 1, in such manner that like reference numerals refer to like components throughout; a convention that we shall employ for the remainder of this specification.

In related embodiments, the electronic housing assembly 100 can be a housing for SMT isolators and circulators, which manipulate incoming signals into its terminals. The housing 100 serves as an external conductor for the device. the electronic housing assembly 100 enables reduced footprint of the device, and optimization of assembly for mass production.

In related embodiment, the design of the electronic housing assembly 100 allows for increased performance and enables a stamping assembly process, instead of a screw down or turn lock process. This stamping process allows for automated assembly as well as reduces the total cost of the unit, and it is easier and simpler than previous methods resulting in a smaller footprint. The two walls and the top cover are both secured together using a unique 3-part locking mechanism.

In another related embodiment, the electronic housing assembly 100 can increase performance of a contained electronic component, such as a circulator or isolator, by reducing magnetic leakage, and a new way to secure the assembly of separated parts for small footprint, and enable automatic assembly.

Figure 1A:
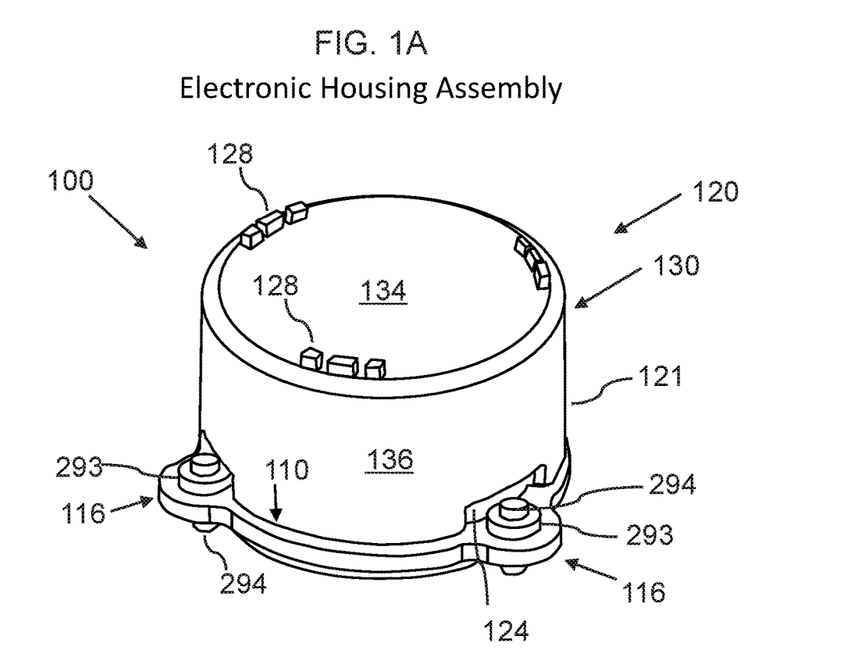
FIG. 1A is a top perspective view of an electronic housing assembly in an assembled state, prior to locking of protruding tabs, according to an embodiment of the invention.
Figure 1B:
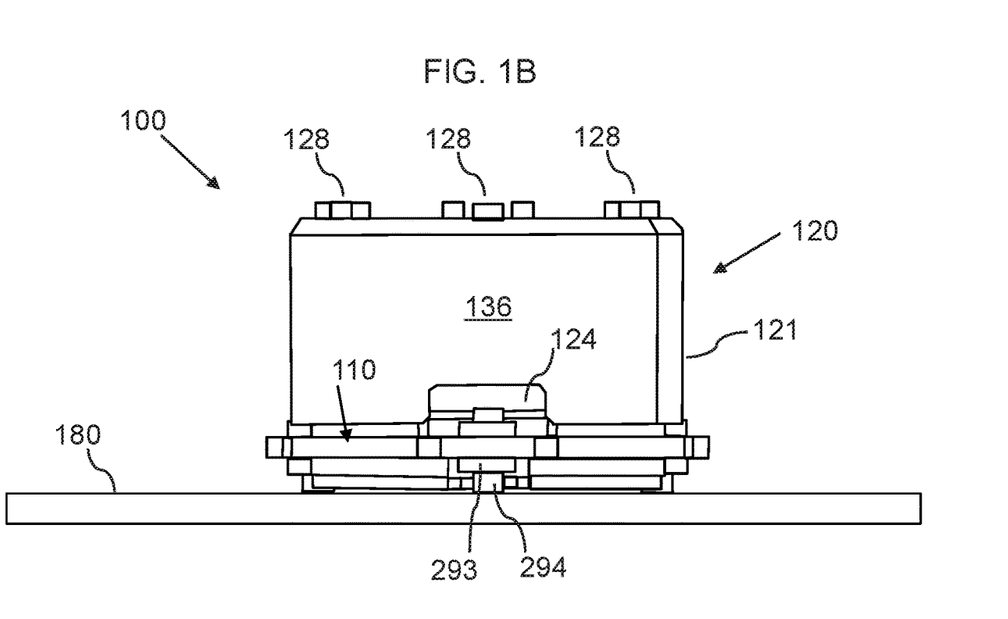
FIG. 1B is a side view of an electronic housing assembly in an assembled state, prior to locking of protruding tabs, according to an embodiment of the invention.
Figure 1C:
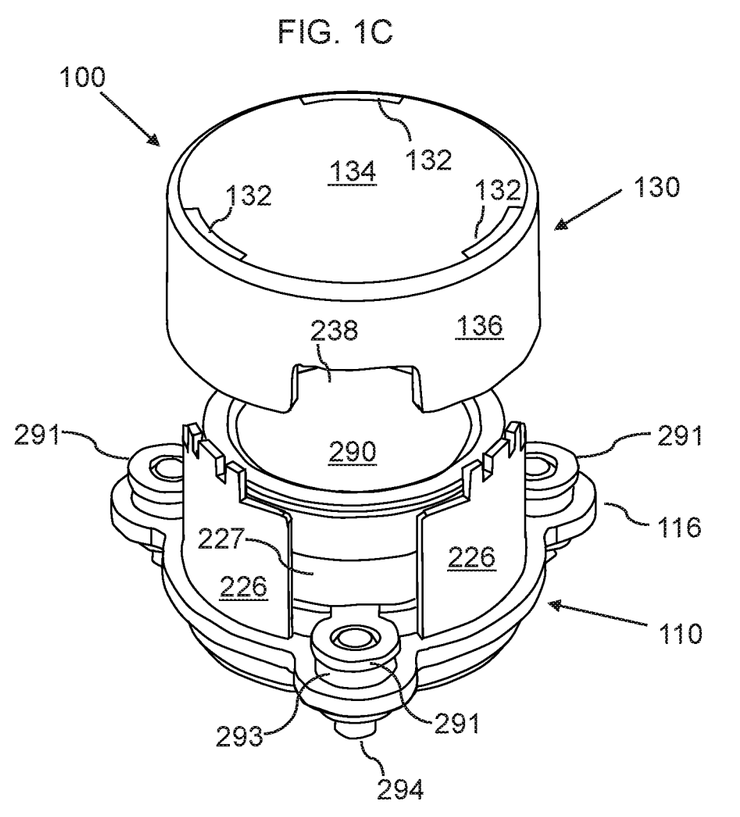
FIG. 1C is a top perspective view of an electronic housing assembly in a partially assembled state, prior to finalizing assembly with a top cover, according to an embodiment of the invention.
Figure 1D:
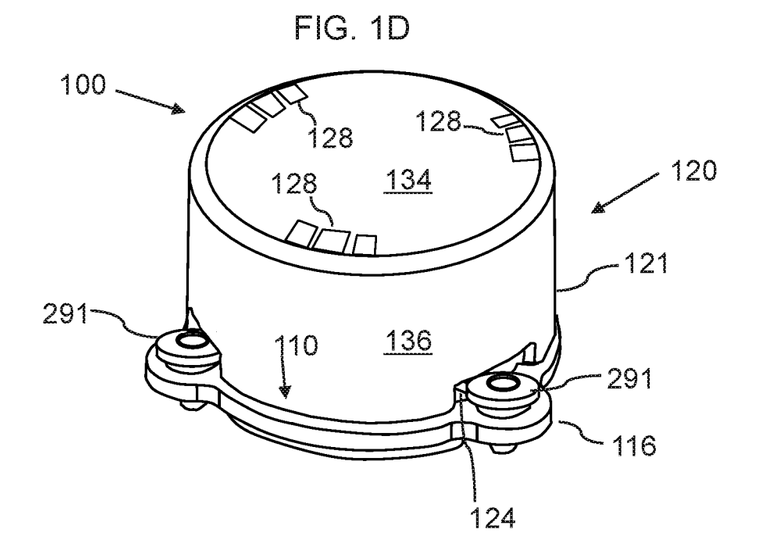
FIG. 1D is a side view of an electronic housing assembly in an assembled state, with protruding tabs locked in position, according to an embodiment of the invention.

In an embodiment, as shown in FIGS. 1A, 1B, 1C, 1D, 2A, and 2E, an electronic housing assembly 100 can include:

a) A plurality of isolated mounting legs 292, which each can include:
  i. a conductive pin 294; and
  ii. an isolator sleeve 293, which can be a hollow cylindrical member 293 made from a non-conductive insulation material, such as rubber or plastic, wherein the isolator sleeve 293 is mounted on the conductive pin 294, such that an upper end of the conductive pin 294 is exposed, such that the upper end of the conductive pin 294 is configured to be connected to an electronic terminal 291 of an electronic member 290, such as an isolator/circulator member 290, and such that a bottom end of the conductive pin 294 is exposed, such that the bottom end of the conductive pin 294 is configured to be connected to a circuit board 180, for example by soldering, as shown in FIG. 1B;

b) A bottom ring 110, which can include:
  i. a ring body 212, which is ring-shaped and includes a ring aperture 214;
  ii. a plurality of outward protruding ring portions 116, which for example can be three outward protruding ring portions 116 or four outward protruding ring portions 116, wherein each outward protruding ring portion 116, can include:
    a central aperture 218;
    such that the bottom ring 110 is configured to receive an electronic member 290, such as an isolator/circulator member 290, such that each isolated mounting leg 292 of the isolator/circulator member 290 protrudes through a corresponding central aperture 218 of a corresponding outward protruding ring portion 116, such that the isolator/circulator member 290 is firmly connected to the bottom ring 110, such that the isolator/circulator member 290 is electrically isolated from the bottom ring 110, such that the isolator/circulator member 290 is electrically isolated from the electronic housing assembly 100;
  iii. a plurality of inward protruding ring portions 217, which each protrude from an inner side of the bottom ring 110, on an opposite side of an opposing outward protruding ring portion 116;
    wherein each corresponding inward protruding ring portion 217 is configured to protrude through a corresponding wall opening 227 and contact with the bottom mounting portion 221.

c) a bottom mounting assembly 220, which can include:
  i. a bottom mounting portion 221, which can include:
    a bottom plate 222; and
    a receiving plate 223, which is mounted on a top of the bottom plate 122, inside a periphery of the bottom plate 122, such that the receiving plate 223 can be configured to provide an even upper surface;
  ii. a plurality of inner walls 224, which for example can be three or four inner walls 224, which as shown each can be configured as a cylinder segment, such that the inner walls 224 are perpendicularly connected to the periphery of the bottom plate 222 with equidistant spacing, such that a plurality of wall openings 227 form between the inner walls 224, such that the inner walls protrude upwards from the bottom plate 222,
    wherein each inner wall 224 can include:
      a wall body 226; and at least one protruding tab 128, connected to a top end of the wall body 226, wherein the at least one protruding tab 128 can include at least one tab slit 229 positioned in a top portion of the protruding tab 128, such that the at least one tab slit 229 functions to ease bending of the protruding tab 128 to lock the fully assembled electronic housing assembly 100, as shown in FIGS. 1C and 4A; and d) a top cover 130, which can also referred to as a top cap 130, which is configured to seal the cavity that the isolator/circulator member 290 can be mounted in, inside the electronic housing assembly 100, wherein the top cover 130 can include:

i. a plurality of tab apertures 132, positioned in an upper portion of the top cover 130, such that each corresponding tab aperture 132 is configured to receive a corresponding protruding tab 128 of a corresponding inner wall 224;

such that the corresponding protruding tab 128 protrudes through the corresponding tab aperture 132 and is folded onto the top cover 130;

such that the top cover 130 is secured in position, thereby locking the electronic housing assembly 100;

ii. a top plate 134, which can be circular as shown; and iii. an outer peripheral wall 136, which can be cylindrical, such that the outer peripheral wall 136 is connected to an outer periphery of the top plate 134, wherein the plurality of tab apertures 132 can be formed as notches 132 in the outer periphery of the top plate 134, wherein the outer peripheral wall 136 can further include:

a plurality of wall notches 238, which each provide an aperture 238 for a corresponding electronic terminal 291 of the electronic member 290 to protrude through when the electronic housing assembly 100 is fully assembled;

whereby the plurality of inner walls 224 and the outer peripheral wall 136, along with the top plate 134, form a double layer to protect the internally mounted isolator/circulator member 290;

wherein the bottom ring 110 with the isolator/circulator member 290 mounted is configured to slide over an outer side of the bottom mounting assembly 220, such that the bottom ring 110 rests on the bottom mounting assembly 220;

such that each wall opening 227 in the plurality of wall openings 227 is aligned with a corresponding wall notch 238 in the plurality of wall notches 238;

such that a corresponding electronic terminal 291 of the electronic member 290 protrude through a corresponding wall opening 227 and a corresponding wall notch 238, wherein the corresponding wall opening 227 and a corresponding wall notch 238 form an enclosure opening 124;

such that each corresponding inward protruding ring portion 217 of the ring body 112 protrude into a corresponding wall opening 227 and contacts with a part 258, 259 of the bottom mounting assembly 220;

such that the top cover 130 can be pressed down and slide over an outer side of the inner walls 224 of the bottom mounting assembly 220, such that a lower end of the outer peripheral wall 136 of the top cover 130 contacts with and rests on the bottom ring 110, such that the bottom ring is securely held in position (i.e. sandwiched) between the lower end of the outer peripheral wall 136 and the bottom mounting assembly 220;

such that tabs 128 of the inner walls 224 protrude through the tab apertures 132 and are folded/bent onto the top plate 134 of the top cover 130, such that the top cover 130 is secured in position, thereby locking the electronic housing assembly 100 with the isolator/circulator member 290 mounted inside the electronic housing assembly 100, as shown in FIG. 1D, i.e. inside the housing enclosure formed by the top cover 130 and the bottom mounting assembly 220.

Figure 2A:
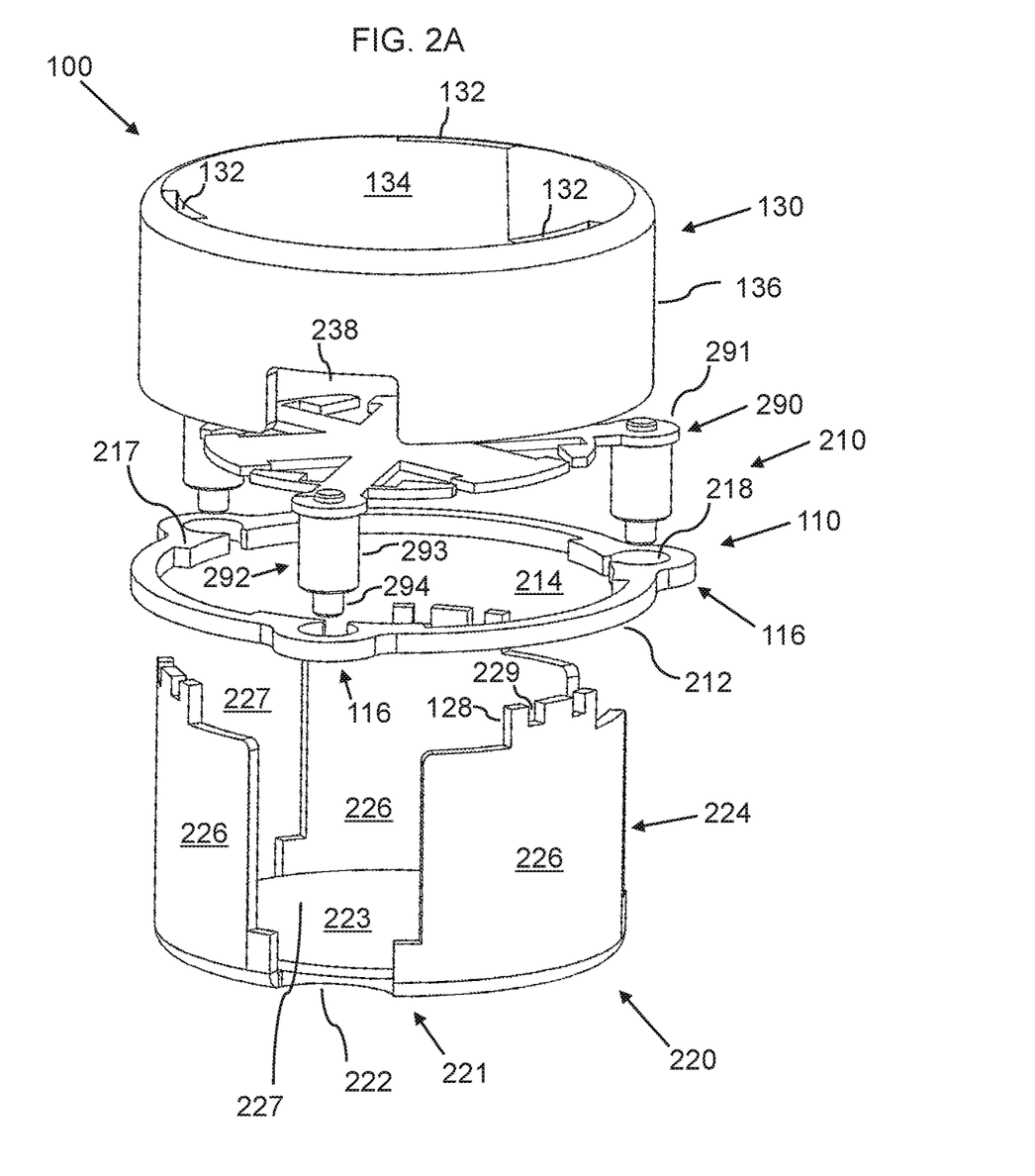
FIG. 2A is a top perspective view of parts of an electronic housing assembly in a disassembled state, according to an embodiment of the invention.
Figure 2B:
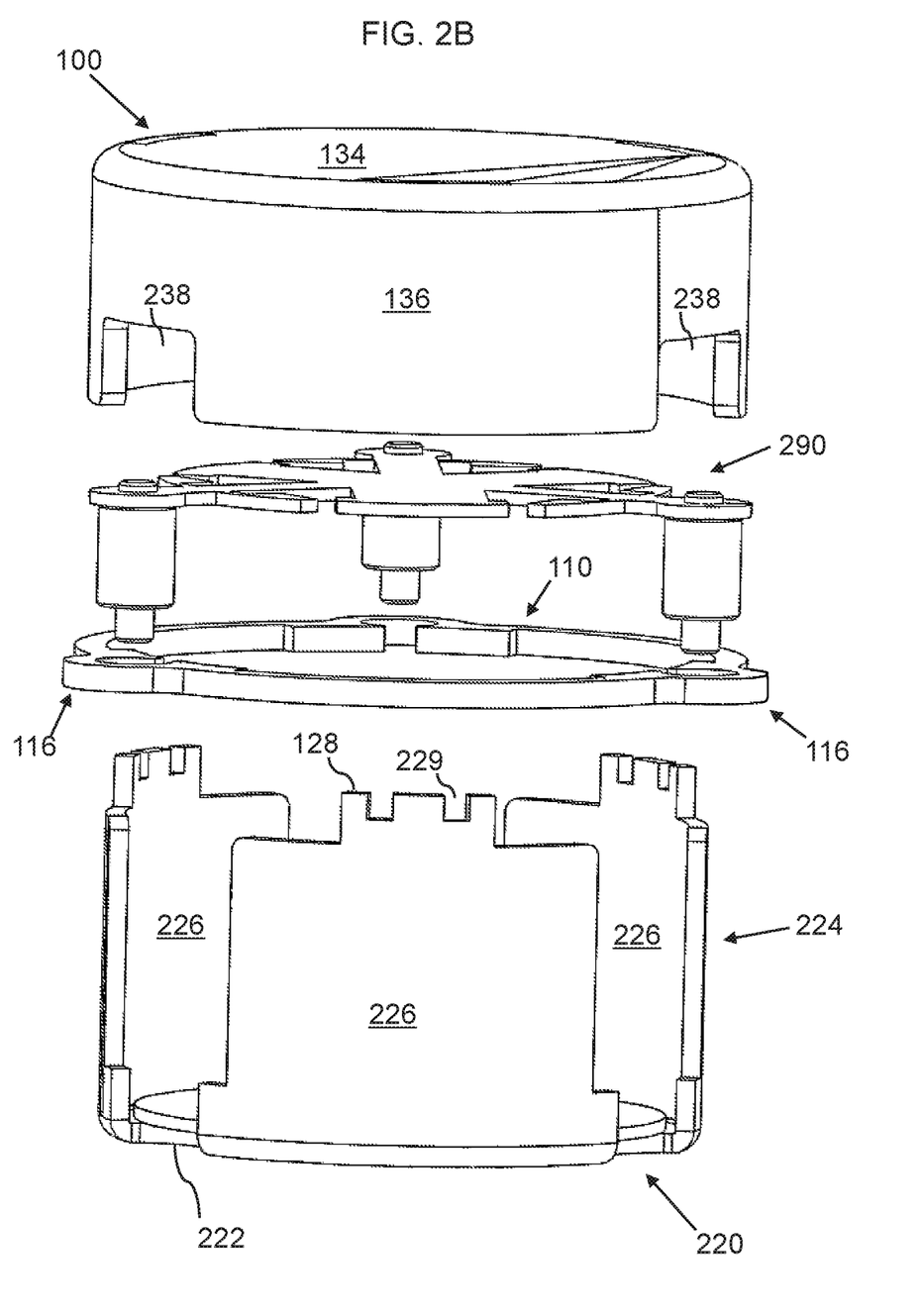
FIG. 2B is a side perspective view of parts of an electronic housing assembly in a disassembled state, according to an embodiment of the invention.
Figure 2C:
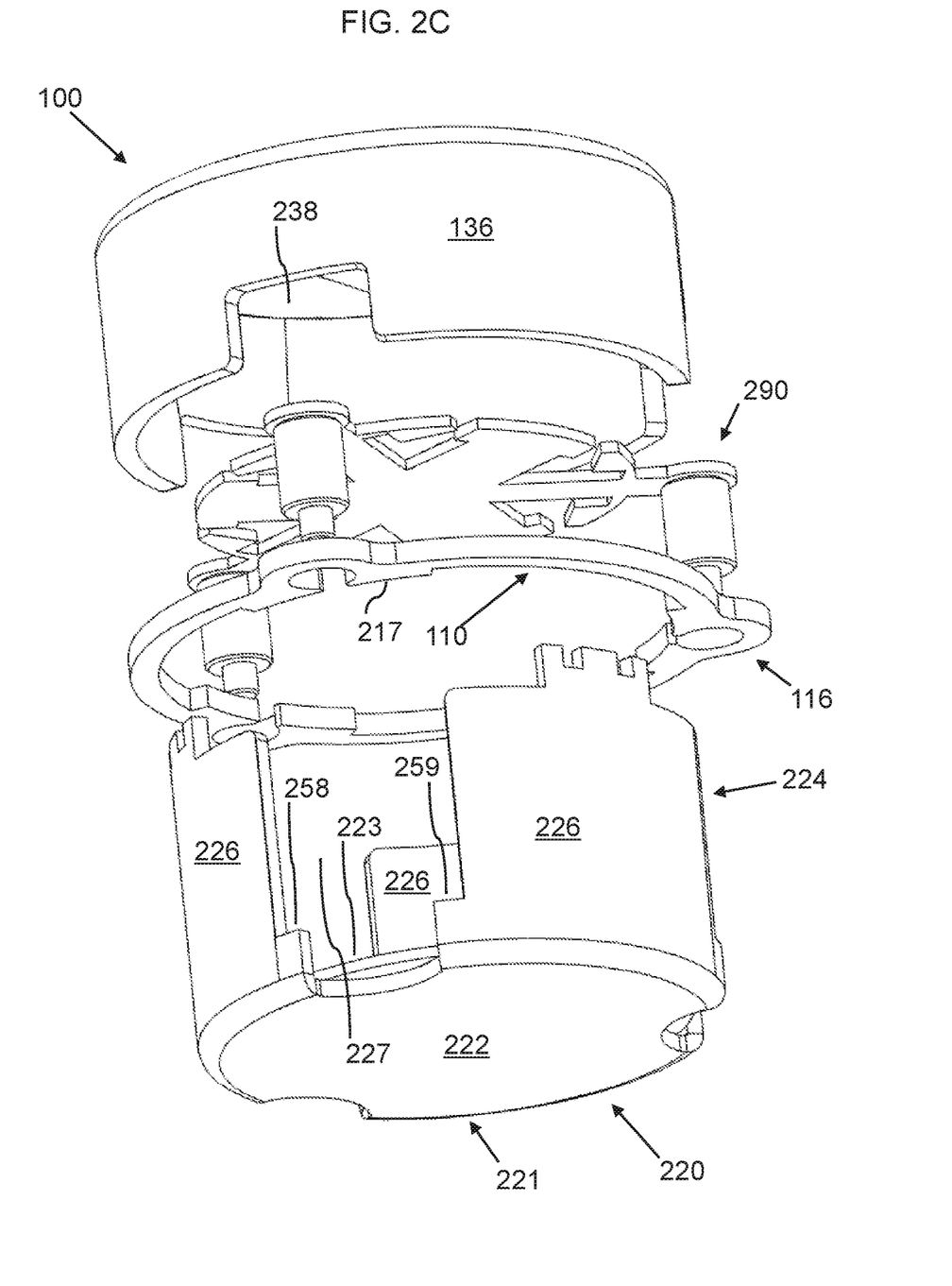
FIG. 2C is a first bottom perspective view of parts of an electronic housing assembly in a disassembled state, according to an embodiment of the invention.
Figure 2D:
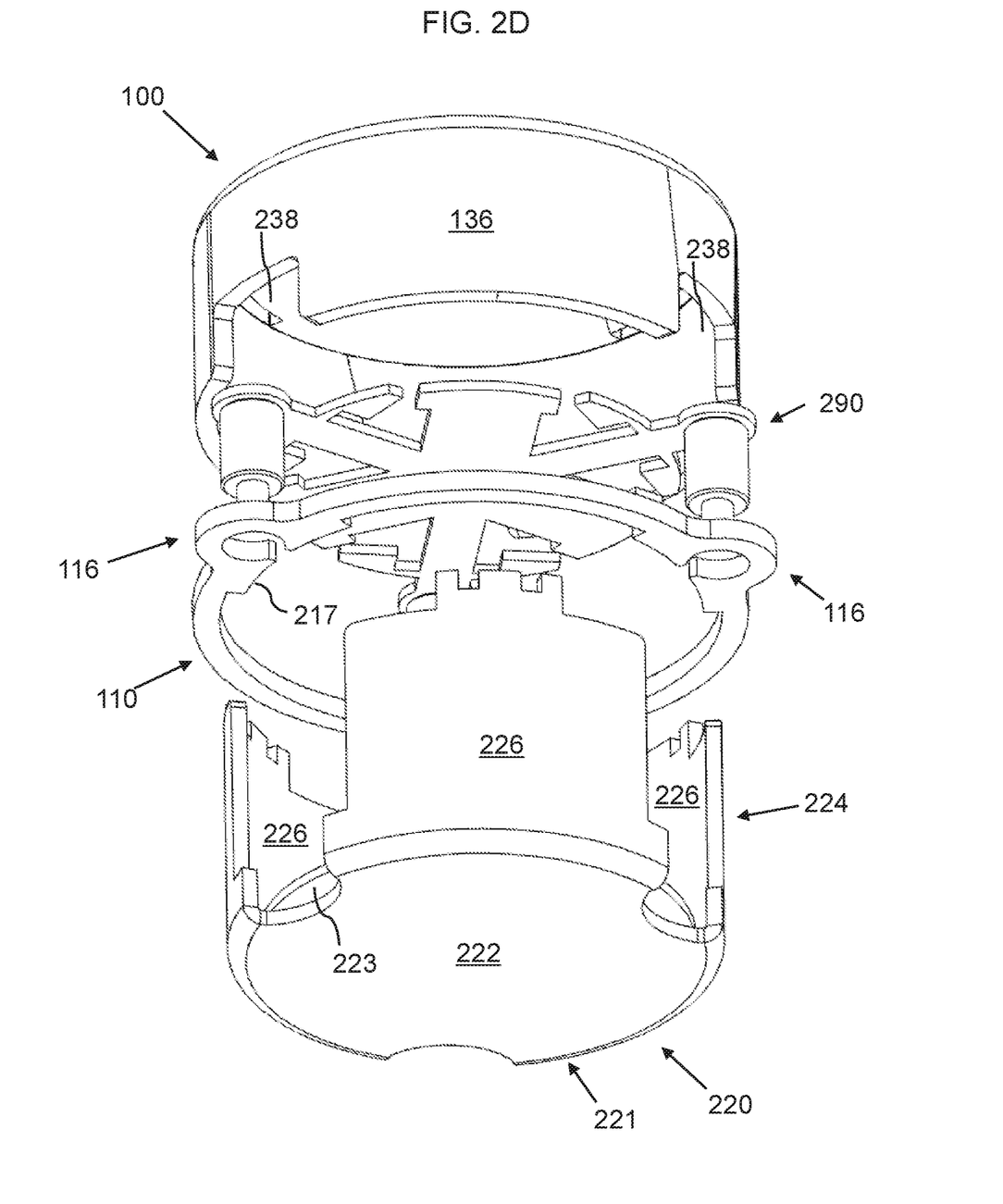
FIG. 2D is a second bottom perspective view of parts of an electronic housing assembly in a disassembled state, according to an embodiment of the invention.
Figure 2E:
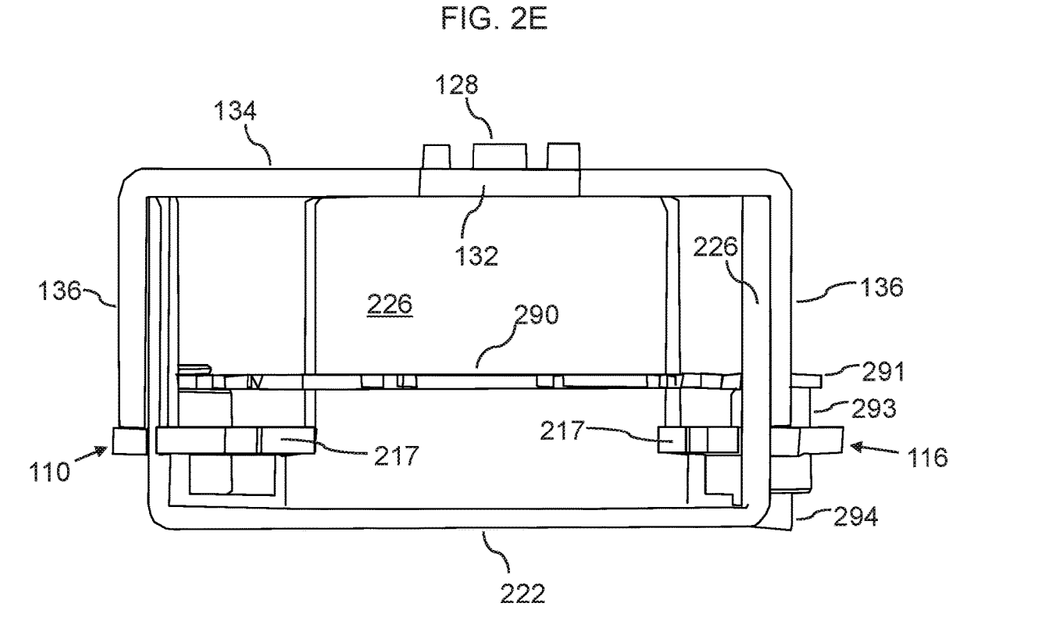
FIG. 2E is a schematic cross-sectional side view of an electronic housing assembly in an assembled state, according to an embodiment of the invention.

Note that FIGS. 1A and 1B show the electronic housing assembly 100 without the isolator/circulator member 290 and FIGS. 2C and 2D show the electronic housing assembly 100 with the isolator/circulator/electronic member 290. In FIG. 1C, an expanded version of the isolator/circulator/electronic member 290 is shown, whereas in other Figures a minimal version of the isolator/circulator/electronic member 290 is shown for clarity.

In a related embodiment, as shown in FIG. 2C, each wall body 226 can include a a) a side ledge 258, 259, positioned on a vertical side of the wall body 226;

such that each corresponding inward protruding ring portion 217 of the ring body 112 protrudes into a corresponding wall opening 227 and is configured to contact with a pair of opposing side ledges 258, 259, such that the bottom ring 110 rests on the plurality of inner walls;

such that the side ledge 258, 259 can be configured to adjust a height of the bottom ring 110 and the bottom end of the conductive pin 294, to facilitate soldering of the bottom end of the conductive pin 294 to the circuit board 180. The outward protruding ring portion 116 provides spacing/separation from a bottom of the electronic housing assembly 100 to avoid mis-soldering, In various related embodiments, the bottom ring 110, the bottom mounting assembly 220, and the top cover 130 can be made of stainless steel, or another metal alloy with sufficient electromagnetic shielding properties.

Figure 3A:
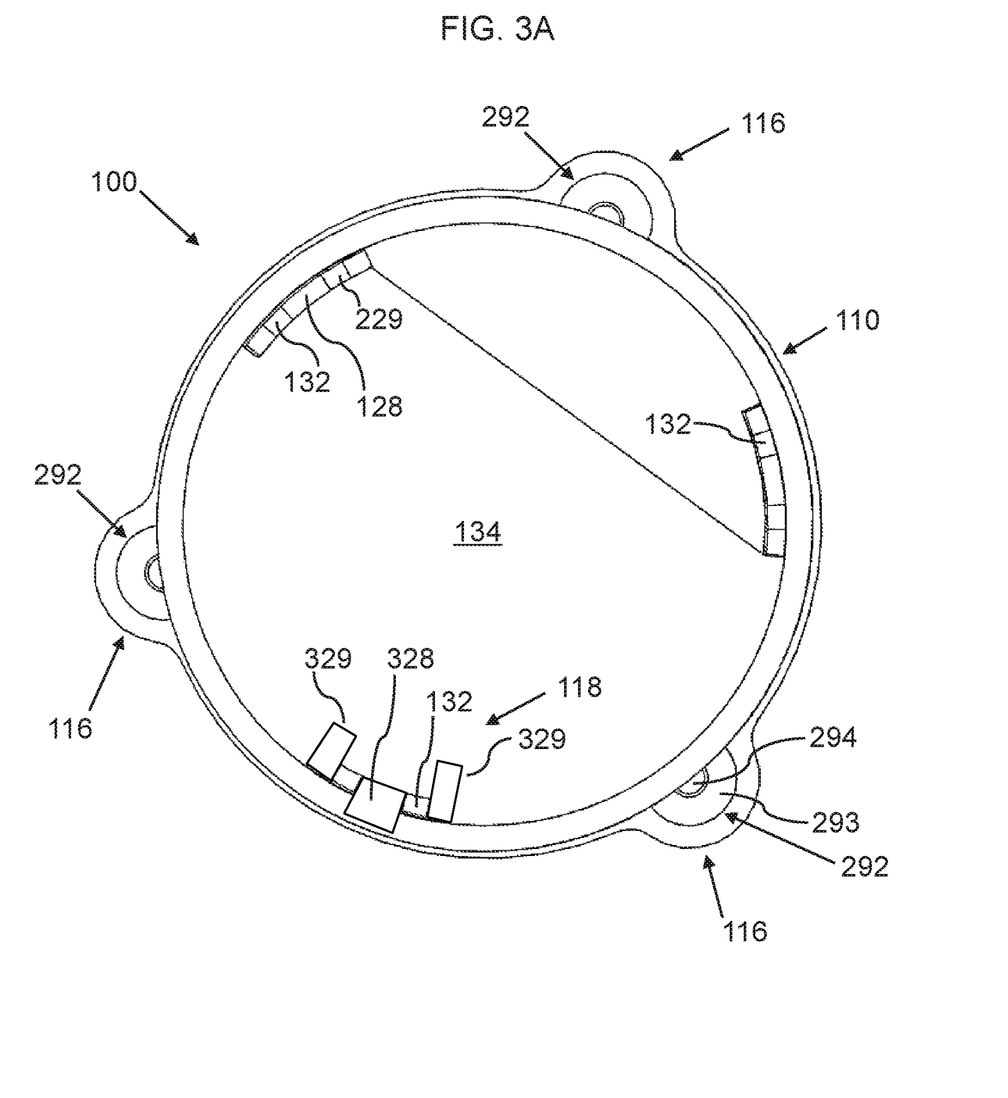
FIG. 3A is a top view of an electronic housing assembly in an assembled state, prior to locking of protruding tabs, according to an embodiment of the invention.
Figure 3B:
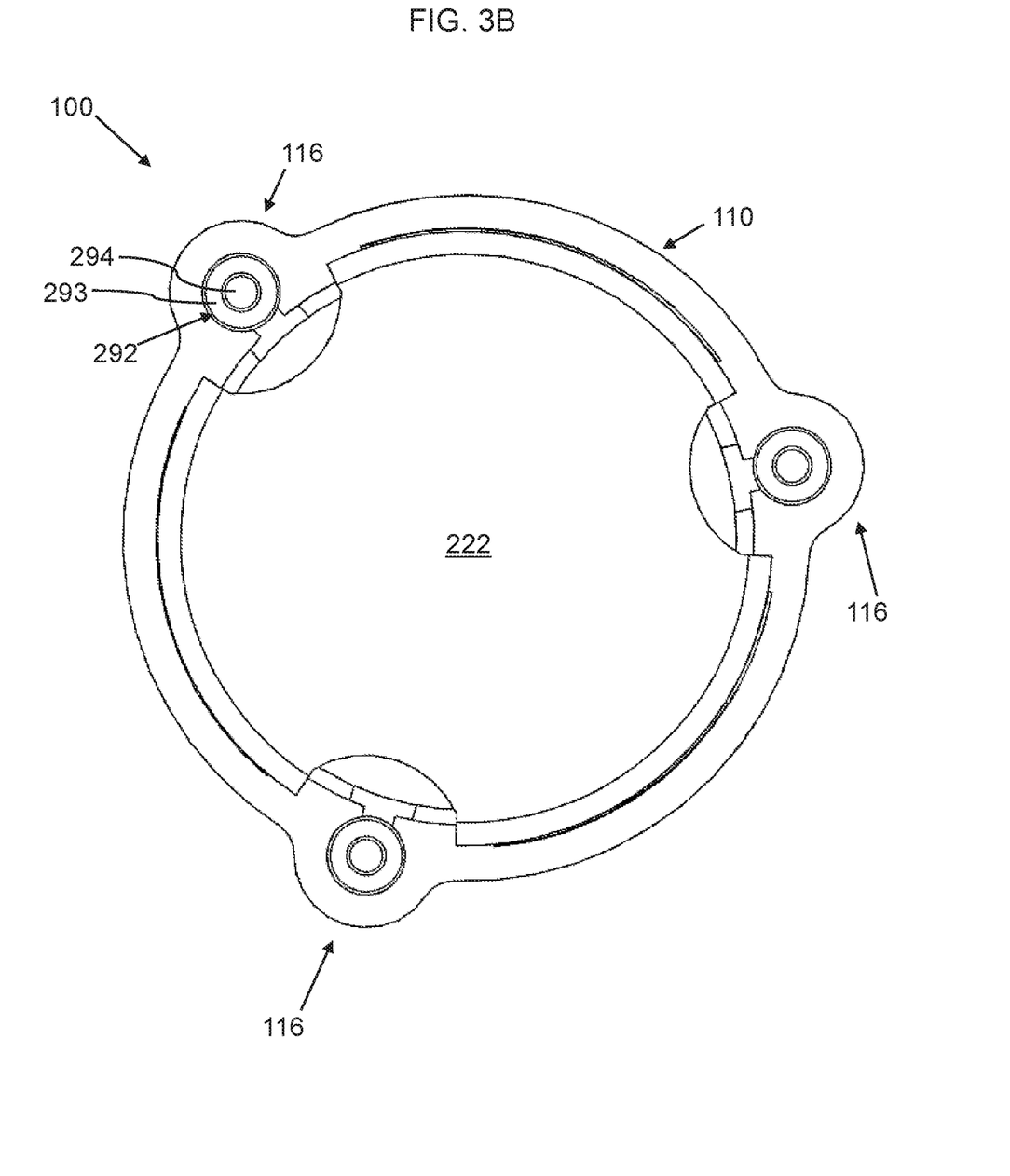
FIG. 3B is a bottom view of an electronic housing assembly in an assembled state, prior to locking of protruding tabs, according to an embodiment of the invention.

In another related embodiment, as shown in FIG. 3A, wherein each protruding tab 128 can include three tab portions 328, 229, including:

a) a central tab portion 328; and b) two side tab portions 329, which each are smaller than the central tab portion, and positioned on first and second sides of the central tab portion 328. During the stamping process, the side tab portions 329 can be folded in an opposite direction of the central tab portion 328, which thereby provides a secure hold between the cover 130 and the inner walls 224.

Thus, in an embodiment, as shown in FIGS. 1A and 2A, an electronic housing assembly 100 can include:

a) a bottom mounting assembly 220, which can include:
  a bottom mounting portion 221; and
  a plurality of inner walls 224, which can be perpendicularly connected to a periphery of the bottom mounting portion 221 with equidistant spacing, such that a plurality of wall openings 227 form between the inner walls 224, such that the inner walls 224 protrude upwards from the bottom mounting portion 221; and b) a top cover 130, which can include:
  a top plate 134; and an outer peripheral wall 136, such that the outer peripheral wall 136 is connected to an outer periphery of the top plate 134, wherein the outer peripheral wall 136 can include:

a plurality of wall notches 238, which each provide an aperture for a corresponding electronic terminal 291 of the electronic member 290 to protrude through when the electronic housing assembly 100 is fully assembled;

wherein the electronic housing assembly 100 is configured to receive an electronic member 290, such that the top cover 130 is configured to be pressed down onto the inner walls 224 of the bottom mounting assembly 220, with the electronic member 290 mounted inside the electronic housing assembly 100, such that the electronic member 290 is shielded from the electronic housing assembly 100 with an insulating mounting 210;

such that each wall opening 227 in the plurality of wall openings 227 is aligned with a corresponding wall notch 238 in the plurality of wall notches 238, such the electronic housing assembly 100 is configured to allow an electronic terminal 291 of the electronic member 290 to protrudes through each wall notch 238 in the plurality of wall notches 238.

In a related embodiment, the insulating mounting 210 can include:

a) a plurality of isolated mounting legs 292, each comprising:

a conductive pin 294; and an isolator sleeve 293, which is made from a non-conductive insulation material, wherein the isolator sleeve 293 is mounted on the conductive pin 294, such that an upper end of the conductive pin 294 is exposed, such that the upper end of the conductive pin 294 is configured to be connected to an electronic terminal 291 of the electronic member 290, and such that a bottom end of the conductive pin 294 is exposed, such that the bottom end of the conductive pin 294 is configured to be connected to a circuit board 180, for example by soldering; and b) a bottom ring 110, which can include:

a ring body 212, which is ring-shaped and includes a ring aperture 214; and a plurality of outward protruding ring portions 116, each comprising a central aperture 218;

such that the bottom ring 110 is configured to hold the electronic member 290, such that for each isolated mounting leg 292, the upper end of the conductive pin 294 is configured to connect to the electronic member 290;

such that the isolator sleeve 293 protrudes through a corresponding central aperture 218 of a corresponding outward protruding ring portion 116, such that the isolator sleeve 293 is firmly connected to the bottom ring 110, such that the electronic member 290 is electrically insulated from the bottom ring 110, such that the electronic member 290 is electrically insulated from the electronic housing assembly 100;

wherein the bottom ring 110 with the electronic member 290 mounted is configured to slide over an outer side of the bottom mounting assembly 220, such that the bottom ring 110 rests on the bottom mounting portion 221 of the bottom mounting assembly 220.

Thus, in another embodiment, as shown in FIGS. 1A, 1B, an electronic housing assembly 100 can include:

a) a mounting enclosure 120, comprising:

i. an enclosure body 121, which can comprise:

a bottom mounting assembly 220; and a top cover 130;

ii. a plurality of enclosure openings 124, which are apertures of the enclosure body 121, wherein each enclosure opening 124 provides an aperture 124 for a corresponding electronic terminal 291 of an electronic member 290 to protrude through; and iii. a plurality of outward protruding portions 116, which protrude from the enclosure body, wherein each outward protruding portion 116 comprises:

a central aperture 218;

b) a plurality of isolated mounting legs 292, each comprising:

i. a conductive pin 294; and ii. an isolator sleeve 293, which is made from a non-conductive insulation material, wherein the isolator sleeve is mounted on the conductive pin 294, such that an upper end of the conductive pin 294 is exposed, such that the upper end of the conductive pin 294 is configured to be connected to the electronic terminal 291 of the electronic member, and such that a bottom end of the conductive pin 294 is exposed, such that the bottom end of the conductive pin 294 is configured to be connected to a circuit board 180; and such that the outward protruding portions 116 are configured to hold the electronic member 290, such for each isolated mounting leg 292, the upper end of the conductive pin 294 is configured to connect to the electronic member 290;

such that the isolator sleeve 293 protrudes through a corresponding central aperture 218 of a corresponding outward protruding portion 116, such that the isolator sleeve 293 is firmly connected to the corresponding outward protruding portion 116, such that the electronic member 290 is electrically isolated from the mounting enclosure 120, such that the electronic member 290 is electrically isolated from the electronic housing assembly 100;

wherein the electronic housing assembly 100 is configured to receive the electronic member 290, with the electronic member 290 mounted in an interior of the electronic housing assembly 100, such that the electronic member 290 is shielded from the electronic housing assembly 100.

In various related embodiments, the electronic housing assembly 100 ensure improved performance of the interior isolator/circulator 290, including:

a) the magnetic leakage is reduced due to the double wall configuration;

b) the stamping process provides even pressure to the top of the isolator/circulator because the top cover is parallel with the top of the isolator/circulator 290;

c) the bottom ring ensures a secure hold on the interior isolator/circulator as well as its precise position within the housing; and d) easier and simpler stamping assembly, when compared to other locking methods, such as screw-down cover or turn-lock cover.

In other various related embodiments, the stamping process provides simple assembly of the electronic housing assembly 100. The top cover 130 is simply pressed down onto the inner walls 224 of the bottom mounting assembly

220. while the tabs 128 of the inner walls 224 are folded into their final positions, to provide the locking mechanism. This process allows for automated assembly, which reduces the cost of production and thereby reduces the cost of the entire assembled unit, including the interior isolator/circulator.

Here has thus been described a multitude of embodiments of the electronic housing assembly 100, and methods related thereto, which can be employed in numerous modes of usage.

The many features and advantages of the invention are apparent from the detailed specification, and thus, it is intended by the appended claims to cover all such features and advantages of the invention, which fall within the true spirit and scope of the invention.

Many such alternative configurations are readily apparent and should be considered fully included in this specification and the claims appended hereto. Accordingly, since numerous modifications and variations will readily occur to those skilled in the art, the invention is not limited to the exact construction and operation illustrated and described, and thus, all suitable modifications and equivalents may be resorted to, falling within the scope of the invention

What is claimed is:

1. An electronic housing assembly, comprising:
 a) a plurality of isolated mounting legs, each comprising:
   a conductive pin; and
   an isolator sleeve, which is made from a non-conductive insulation material, wherein the isolator sleeve is mounted on the conductive pin, such that an upper end of the conductive pin is exposed, such that the upper end of the conductive pin is configured to be connected to an electronic terminal of an electronic member, and such that a bottom end of the conductive pin is exposed, such that the bottom end of the conductive pin is configured to be connected to a circuit board;
 b) a bottom ring, comprising:
   a ring body, which is ring-shaped and comprises a ring aperture; and
   a plurality of outward protruding ring portions, each comprising
   a central aperture;
   such that the bottom ring is configured to hold the electronic member, such that for each isolated mounting leg the upper end of the conductive pin is configured to connect to the electronic member;
   such that the isolator sleeve protrudes through a corresponding central aperture of a corresponding outward protruding ring portion, such that the isolator sleeve is firmly connected to the bottom ring, such that the electronic member is electrically isolated from the bottom ring, such that the electronic member is electrically isolated from the electronic housing assembly;
 c) a bottom mounting assembly, comprising:
   a bottom plate; and
   a plurality of inner walls, which are perpendicularly connected to a periphery of the bottom plate, such that a plurality of wall openings form between the inner walls, such that the inner walls protrude upwards from the bottom plate; and
 d) a top cover, comprising:
   a top plate; and
   an outer peripheral wall, such that the outer peripheral wall is connected to an outer periphery of the top plate, wherein the outer peripheral wall comprises:
   a plurality of wall notches, which each provide an aperture for a corresponding electronic terminal of the electronic member to protrude through;
   wherein the bottom ring with the electronic member mounted is configured to slide over an outer side of the bottom mounting assembly, such that the bottom ring rests on the bottom mounting assembly;
   such that the top cover is configured to be pressed down onto the inner walls of the bottom mounting assembly, with the electronic member mounted inside the electronic housing assembly.

2. The electronic housing assembly of claim 1, wherein the plurality of outward protruding ring portions is three outward protruding ring portions.

3. The electronic housing assembly of claim 1, wherein the isolator sleeve is a hollow cylindrical member.

4. The electronic housing assembly of claim 1, further comprising:
 a receiving plate, which is mounted on a top of the bottom plate, inside a periphery of the bottom plate.

5. The electronic housing assembly of claim 1, wherein each of the inner walls is configured as a cylinder segment.

6. The electronic housing assembly of claim 1, wherein each inner wall in the plurality of inner walls comprises:
 a) a wall body; and
 b) at least one protruding tab, connected to a top end of the wall body;
 wherein the top cover, comprises:
   a plurality of tab apertures, positioned in an upper portion of the top cover, such that each corresponding tab aperture is configured to receive a corresponding protruding tab of a corresponding inner wall;
   such that the corresponding protruding tab protrudes through the corresponding tab aperture and is folded onto the top cover;
   such that the top cover is secured in position, thereby locking the electronic housing assembly.

7. The electronic housing assembly of claim 6, wherein the plurality of tab apertures are formed as notches in the outer periphery of the top plate.

8. The electronic housing assembly of claim 6, wherein each protruding tab comprises:
 a) a central tab portion; and
 b) two side tab portions, which each are smaller than the central tab portion, and positioned on first and second sides of the central tab portion.

9. The electronic housing assembly of claim 8, further comprising:
 the electronic member, wherein the electronic housing assembly is assembled with the electronic member inside;
 such that each of the two side tab portions are folded in an opposite direction of the central tab portion.

10. The electronic housing assembly of claim 1, wherein the top plate is circular and the outer peripheral wall is cylindrical.

11. The electronic housing assembly of claim 1, wherein the bottom ring further comprises:
 a plurality of inward protruding ring portions, which each protrude from an inner side of the bottom ring, on an opposite side of an opposing outward protruding ring portion;
 wherein each corresponding inward protruding ring portion is configured to protrude into a corresponding wall opening and contact with a part of the bottom mounting assembly.

12. The electronic housing assembly of claim 11, wherein each wall body further comprises:
a side ledge, which is positioned on a vertical side of the wall body;
wherein each corresponding inward protruding ring portion is configured to contact with a pair of opposing side ledges, such that the bottom ring rests on the plurality of inner walls.

13. The electronic housing assembly of claim 1, wherein the bottom ring, the bottom mounting assembly, and the top cover are made of stainless steel.

14. An electronic housing assembly, comprising:
a) a bottom mounting assembly, comprising:
a bottom plate; and
a plurality of inner walls, which are perpendicularly connected to a periphery of the bottom plate, such that a plurality of wall openings form between the inner walls, such that the inner walls protrude upwards from the bottom plate; and
b) a top cover, comprising:
a top plate; and
an outer peripheral wall, such that the outer peripheral wall is connected to an outer periphery of the top plate, wherein the outer peripheral wall comprises:
a plurality of wall notches, which each provide an aperture for a corresponding electronic terminal of an electronic member to protrude through;
wherein the electronic housing assembly is configured to receive the electronic member, such that the top cover is configured to be pressed down onto the inner walls of the bottom mounting assembly, with the electronic member mounted inside the electronic housing assembly, such that the electronic member is shielded from the electronic housing assembly;
such that each wall opening in the plurality of wall openings is aligned with a corresponding wall notch in the plurality of wall notches.

15. The electronic housing assembly of claim 14, further comprising:
a) a plurality of isolated mounting legs, each comprising:
a conductive pin; and
an isolator sleeve, which is made from a non-conductive insulation material, wherein the isolator sleeve is mounted on the conductive pin, such that an upper end of the conductive pin is exposed, such that the upper end of the conductive pin is configured to be connected to an electronic terminal of the electronic member, and such that a bottom end of the conductive pin is exposed, such that the bottom end of the conductive pin is configured to be connected to a circuit board; and
b) a bottom ring, comprising:
a ring body, which is ring-shaped and comprises a ring aperture; and
a plurality of outward protruding ring portions, each comprising
a central aperture;
such that the bottom ring is configured to hold the electronic member, such for each isolated mounting leg, the upper end of the conductive pin is configured to connect to the electronic member;
such that the isolator sleeve protrudes through a corresponding central aperture of a corresponding outward protruding ring portion, such that the isolator sleeve is firmly connected to the bottom ring, such that the electronic member is electrically isolated from the bottom ring, such that the electronic member is electrically isolated from the electronic housing assembly;
wherein the bottom ring with the electronic member mounted is configured to slide over an outer side of the bottom mounting assembly, such that the bottom ring rests on the bottom mounting assembly.

16. The electronic housing assembly of claim 14, wherein each inner wall in the plurality of inner walls comprises:
a) a wall body; and
b) at least one protruding tab, connected to a top end of the wall body;
wherein the top cover, comprises:
a plurality of tab apertures, positioned in an upper portion of the top cover, such that each corresponding tab aperture is configured to receive a corresponding protruding tab of a corresponding inner wall;
such that the corresponding protruding tab protrudes through the corresponding tab aperture and is folded onto the top cover;
such that the top cover is secured in position, thereby locking the electronic housing assembly.

17. The electronic housing assembly of claim 15, wherein the bottom ring further comprises:
a plurality of inward protruding ring portions, which each protrude from an inner side of the bottom ring, on an opposite side of an opposing outward protruding ring portion;
wherein each corresponding inward protruding ring portion is configured to protrude into a corresponding wall opening and contact with a part of the bottom mounting assembly.

18. An electronic housing assembly, comprising:
a) a mounting enclosure, comprising:
an enclosure body;
a plurality of enclosure openings, which are apertures of the enclosure body, wherein each enclosure opening provides an aperture for a corresponding electronic terminal of an electronic member to protrude through; and
a plurality of outward protruding portions, which protrude from the enclosure body, wherein each outward protruding portion comprises:
a central aperture;
b) a plurality of isolated mounting legs, each comprising:
a conductive pin; and
an isolator sleeve, which is made from a non-conductive insulation material, wherein the isolator sleeve is mounted on the conductive pin, such that an upper end of the conductive pin is exposed, such that the upper end of the conductive pin is configured to be connected to the electronic terminal of the electronic member, and such that a bottom end of the conductive pin is exposed, such that the bottom end of the conductive pin is configured to be connected to a circuit board; and
such that the outward protruding portions are configured to hold the electronic member, such for each isolated mounting leg, the upper end of the conductive pin is configured to connect to the electronic member;
such that the isolator sleeve protrudes through a corresponding central aperture of a corresponding outward protruding portion, such that the isolator sleeve is firmly connected to the corresponding outward protruding portion, such that the electronic member is electrically isolated from the mounting enclosure, such that the electronic member is electrically isolated from the electronic housing assembly;
wherein the electronic housing assembly is configured to receive the electronic member, with the electronic member mounted in an interior of the electronic housing assembly, such that the electronic member is shielded from the electronic housing assembly.

19. The electronic housing assembly of claim 18, further comprising:
   a bottom ring, comprising:
      a ring body, which is ring-shaped and comprises a ring aperture; and
      the plurality of outward protruding portions, which each protrude from the ring body;
   wherein the bottom ring is configured to slide over an outer side of the mounting enclosure, such that the bottom ring rests on the mounting enclosure.

20. The electronic housing assembly of claim 18, wherein the enclosure body further comprises:
   a) a bottom mounting assembly, comprising:
      a bottom plate; and
      a plurality of inner walls, which are perpendicularly connected to a periphery of the bottom plate, such that a plurality of wall openings form between the inner walls, such that the inner walls protrude upwards from the bottom plate; and
   b) a top cover, comprising:
      a top plate; and
      an outer peripheral wall, such that the outer peripheral wall is connected to an outer periphery of the top plate, wherein the outer peripheral wall comprises:
         a plurality of wall notches, which each provide an aperture for a corresponding electronic terminal of an electronic member to protrude through;
   wherein the electronic housing assembly is configured to receive the electronic member, such that the top cover is configured to be pressed down onto the inner walls of the bottom mounting assembly, with the electronic member mounted inside the electronic housing assembly, such that the electronic member is shielded from the electronic housing assembly;
   such that each wall opening in the plurality of wall openings is aligned with a corresponding wall notch in the plurality of wall notches.

* * * * *